July 27, 1965 H. F. PAUL 3,197,713

HIGH GAIN TUNED AMPLIFIER WITH CATHODE INPUT CIRCUIT

Filed Dec. 28, 1962

INVENTOR.
HARRY F. PAUL

BY
Weingarten, Orabuch & Pandiscio

ATTORNEYS

United States Patent Office 3,197,713
Patented July 27, 1965

3,197,713
HIGH GAIN TUNED AMPLIFIER WITH CATHODE INPUT CIRCUIT

Harry F. Paul, Tilton, N.H., assignor to Tram Electronics, Inc., Winnisquam, N.H., a corporation of New Hampshire Filed Dec. 28, 1962, Ser. No. 247,941
8 Claims. (Cl. 330—186)

This invention relates to amplifiers and more particularly to a novel tuned amplifier adapted to provide exceptionally high gain.

Tuned amplifiers are generally employed to selectively amplify a single frequency or a narrow band of frequencies. The most common use is in the I.F. stage of a radio receiver where the I.F. amplifier must have a frequency band of about 10 kc. with a center frequency of 455 kc. A common type of tuned amplifier includes a parallel resonant circuit as part of the circuit by which it is coupled to the previous stage. The parallel resonant circuit achieves narrow band amplification because it offers high impedance at the desired frequency and low impedance at other frequencies. Other forms of tuned amplifiers embodying tuned circuits in the plate and grid circuits also are well known.

The primary object of the present invention is to provide a novel tuned amplifier which provides exceptionally high amplification while at the same time being relatively simple in construction and dependable in operation.

Still another object of this invention is to provide a tuned amplifier which permits amplification of a relatively narrow band of frequencies about a stable center frequency without any material frequency or phase distortion.

Another important object of the present invention is to provide a high-gain tuned amplifier which is relatively inexpensive to construct.

Other objects and many of the attendant advantages of the invention will be readily appreciated as the invention becomes better understood by reference to the following detailed description when considered in connection with the accompanying drawings wherein.

Figure 1:
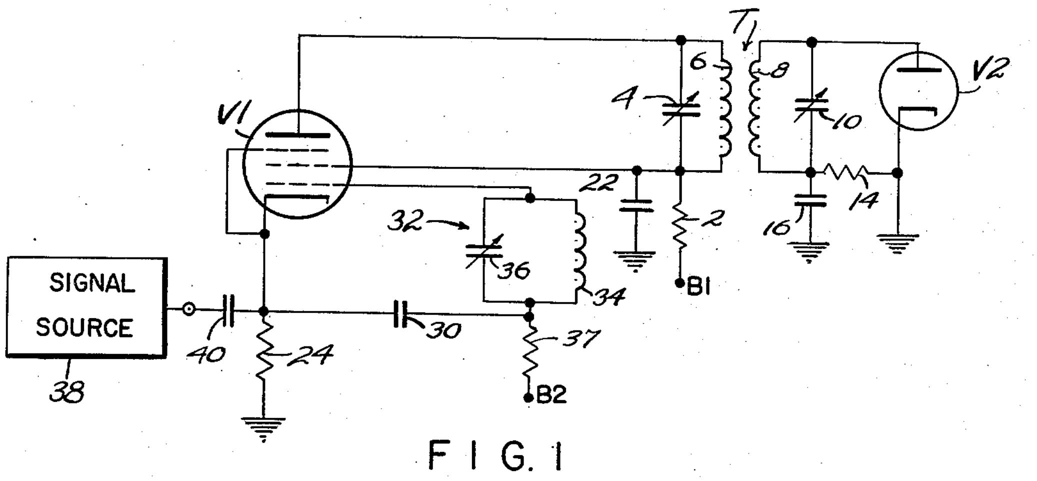
FIG. 1 is a diagram of a tuned I.F. amplifier embodying the present invention.

Referring now to FIG. 1, the illustrated amplifier comprises a pentode V1 having its plate connected to a voltage source B1 via a plate registor 2 and a parallel resonant circuit tuned to 455 kc. comprising a variable capacitor 4 and a coil 6. The latter forms the primary of a coupling transformer T which includes a secondary coil 8. The latter and a variable capacitor 10 together form a tuned output circuit connected across a detector tube V2 with a resistor 14 interposed between it and the cathode which is grounded. The junction of resistor 14 and the output tuned circuit is connected to ground by a capacitor 16.

Referring now to tube V1, its screen grid is connected to voltage source B1 via resistor 2 and to ground via a capacitor 22. The suppressor grid is connected directly to the cathode which is connected to ground by a resistor 24. Connected in series between the cathode and the control grid of tube V1 in the order named is a blocking capacitor 30 and a tuned input circuit identified generally at 32 comprising a coil 34 and a variable capacitor 36. The circuit 32 is tuned for a 455 kc. signal. The junction of capacitor 30 and the tuned input circuit is connected via a resistor 37 to a bias voltage source B2. By way of example, the bias voltage could be a variable signal derived from an automatic volume control circuit. The signal to be amplified is derived from the prior stage represented as a signal source 38 and applied to the system by a coupling capacitor 40 connected between the source and the cathode of tube V1.

Figure 2:
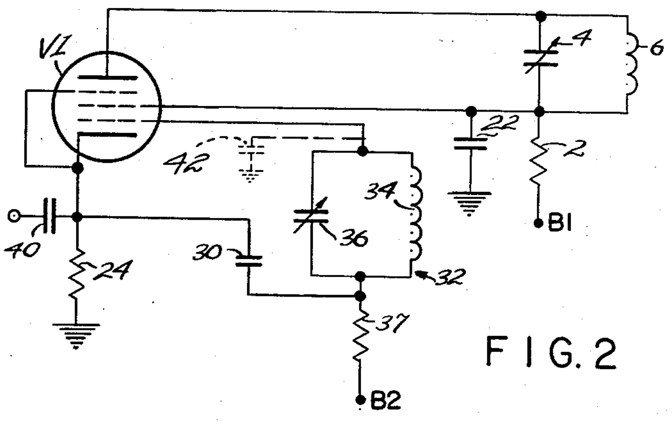
FIG. 2 is essentially the same as FIG. 1 but illustrates how the grid-to-ground interelectrode capacitance of tube V1 forms part of a capacity divider involved in achieving gain multiplication.
Figure 3:
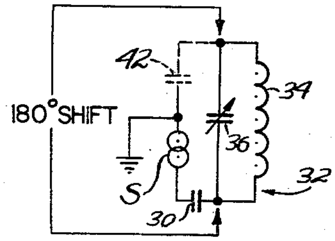
FIG. 3 shows how the signal input circuit of FIG. 2 shifts the input signal 180°.

Referring now to FIG. 2, tube V1 is characterized by a grid-to-ground capacitance 42 whose capacitive reactance is high in comparison to that of capacitor 30. Capacitance 42 is primarily the capacitance between signal grid to heater and signal grid to screen grid (the latter is at ground for R.F. because of capacitor 22). Capacitance 42 and blocking capacitor 30 effectively form a capacity divider across the tuned circuit 32 with a tap at the point of signal feed. If the input signal tap is considered to be a signal generator S, the input circuit of tube V1 can be redrawn as in FIG. 3. It is believed to be apparent that when a signal is applied, one end of resonant circuit 32 will be positive when the opposite end is negative. Therefore, if the input signal is positive, the bottom end of resonant circuit 32 coupled to blocking capacitor 30 will go positive while the opposite end will go negative. When an input signal goes negative, the bottom end of the resonant circuit will go negative while the upper end will go positive.

With the foregoing phase reversal in mind, operation of the gain multiplier circuit is as follows: Since the incoming signal is applied to the cathode of tube V1 across the resistance 24, when the signal goes positive, the effect is the same as if a negative signal had been applied to the grid; that is, the voltage difference between the grid and cathode is reduced. Correspondingly, when the signal goes negative, the voltage difference between the grid and cathode is increased. Therefore, when the signal is positive, the current carried by the tube will drop and the output voltage in the plate circuit will increase; when the signal is negative, the tube current will increase and the output voltage in the plate circuit will decrease. The signal amplification thus effected is multiplied by the tuned circuit 32 since the latter provides a 180° phase shift. When the input signal swings positive so as to raise the cathode potential and thereby reduce the difference between the grid and the cathode, the same signal will be applied to the grid via the tuned circuit 32. However, the signal applied to the grid will have the reverse polarity and thereby will drive the grid potential in a negative direction so as to further reduce the voltage difference between the grid and cathode. As a consequence, the tube current will decrease and the output voltage will increase to a much larger degree than is possible otherwise. Gain multiplication occurs in a corresponding manner when the input signal swings in a negative direction, the signal to the grid being positive. Since the circuit 32 is tuned to 455 kc., the only signals which will be amplified greatly are those nearest to 455 kc. falling within the bandwidth of the tuned circuit.

Maximum gain occurs when the signal phase shift attained via the tuned circuit 32 is exactly 180°. This phase shift may not always occur when the circuit 32 is tuned exactly to 455 kc. Accordingly, in practice it may be necessary to tune off slightly from 455 kc. to get maximum gain. Since the circuit has an appreciable Q, it is not necessary to tune off very much to get the correct phase shift. However, the adjustment is not critical.

The advantages of the invention herein described and illustrated are believed obvious. First of all, it provides very high amplification. Gains of up to 10,000 times may be achieved with high impedance transformers and high gain tubes. Secondly, it is not limited to one type of tube. Thus, for example, highly satisfactory results may be achieved using types 6BA6, 6EW6, and 6BH6 as tube V1. Thirdly, the invention is not limited to 455 kc. but will function as well at other frequencies. Fourthly, the system is essentially simple in concept, and, therefore, its construction, tuning, and troubleshooting are straightforward and economical in terms of materials, labor, and equipment.

Obviously, many other modifications and variations of the present invention are possible in the light of the foregoing teachings. It is to be understood, therefore, that the invention is not limited in its application to the details of construction and arrangement of parts specifically described or illustrated, and that within the scope of the appended claims, it may be practiced otherwise than as specifically described or illustrated.

I claim:

1. An amplifier comprising an electron tube having a cathode, plate, control grid, screen grid and suppressor grid, a resistor connecting said cathode to ground, a voltage source in the plate circuit of said tube for causing said tube to conduct current, means connecting said suppressor grid to said cathode, means providing an R.E. ground for said screen grid, output means for deriving an A.C. signal voltage from said plate circuit, means for applying an input A.C. signal voltage between said cathode and ground so as to vary the voltage difference between said cathode and said control grid, and circuit means for reversing the polarity of said predetermined input signal voltage and applying it also to said control grid so as to vary said voltage difference further in the same direction, whereby the output signal derived by said output means will have an amplitude which is large relative to the amplitude of said predetermined input signal voltage, said circuit means comprising a tuned LC circuit having one end connected to said cathode and another end connected to said control grid.

2. An amplifier as defined by claim 1 wherein said tuned LC circuit is connected to said cathode by a capacitor, said capacitor and the grid-to-ground capacitance of said tube forming a capacity divider across said tuned circuit.

3. An amplifier as defined by claim 1 wherein said output means comprises a tuned circuit connected in series with said voltage source and said plate.

4. An amplifier comprising a pentode, a first source of D.C. voltage, a first tuned circuit connecting said first D.C. voltage source to the plate of said pentode, means connecting the screen grid of said pentode to said first D.C. voltage source, means providing an RF ground for said screen grid, means connecting together the suppressor grid and the cathode of said pentode, a resistor connected between said cathode and ground, a second source of D.C. voltage, a second tuned circuit having a first end connected to said second D.C. voltage source and a second end connected to the control grid of said pentode, a capacitor connecting said first end of said second tuned circuit to said cathode, said capacitor and the grid-to-ground capacitance of said tube forming a capacity divider across said second tuned circuit and said second tuned circuit adapted to provide at its second end polarity reversal of a signal applied to its first end, and means for applying an input A.C. voltage signal between said cathode and ground to vary the voltage difference between said cathode and grid in a direction determined by the polarity of said signal, whereby said second tuned circuit applies said same input A.C. voltage signal but with reverse polarity to said grid to vary said voltage difference further in the same direction.

5. An amplifier comprising an electron tube having a plate, cathode, screen grid and control grid, a resistor connecting said cathode to ground, a voltage source means connecting said screen grid to said voltage source, a first tuned circuit connecting said voltage source to said plate, means for applying an input A.C. signal voltage between said cathode and ground, circuit means for applying said signal voltage but with reverse polarity as an input to said control grid, said circuit means comprising a second tuned circuit having one end connected to said cathode by way of a capacitor and the other end connected to said control grid, said capacitor and the grid-to-ground capacitance of said tube forming a capacity divider across said second tuned circuit, and output means for deriving an output A.C. signal from said first tuned circuit in response to said input A.C. signal voltage.

6. An amplifier comprising an electron tube having a plurality of electrodes including a plate, cathode and control grid, a voltage source in the plate circuit of said tube whereby to cause said tube to conduct current, output means for deriving an A.C. output signal from said plate circuit, means for applying an input A.C. signal voltage to said cathode to vary the voltage difference between said cathode and grid in a direction determined by the polarity of said signal voltage, and a tuned circuit having one end connected to said cathode by a capacitor and another end connected to said control grid, said capacitor and the grid-to-ground capacitance of said tube forming a capacity divider across said tuned circuit with said tuned circuit operative to reverse the polarity of said signal voltage and apply it to said control grid so as to vary said voltage difference further in the same direction, whereby the output signal derived by said output means has an amplitude which is a large multiple of the amplitude of said input A.C. signal voltage.

7. An amplifier comprising an electron tube having a plate, cathode, control grid and screen grid, a resistor connecting said cathode to ground, means for applying a D.C. voltage to said screen grid, a voltage source in the plate circuit of said tube whereby to cause said tube to conduct current, output means for deriving an A.C. output signal from said plate circuit, means including a coupling capacitor for applying an input A.C. signal voltage to said cathode to vary the voltage difference between said cathode and control grid in a direction determined by the polarity of said signal voltage, and a tuned circuit connected at one end to said cathode and at another end to said control grid for reversing the polarity of said signal voltage and applying it to said control grid so as to vary said voltage difference further in the same direction, whereby the output signal derived by said output means will have an amplitude which is a large multiple of the amplitude of said input A.C. signal voltage.

8. An amplifier as defined by claim 7 wherein said tube is a pentode, and further including a voltage source connected to said one end of said tuned circuit.

References Cited by the Examiner

FOREIGN PATENTS 965,334 6/57 Germany.

ROY LAKE, *Primary Examiner.*

UNITED STATES PATENT OFFICE
CERTIFICATE OF CORRECTION

Patent No. 3,197,713 July 27, 1965

Harry F. Paul

It is hereby certified that error appears in the above numbered patent requiring correction and that the said Letters Patent should read as corrected below.

Column 3, line 23, for "R.E." read -- R.F. --.

Signed and sealed this 22nd day of February 1966.

(SEAL)
Attest:

ERNEST W. SWIDER
Attesting Officer

EDWARD J. BRENNER
Commissioner of Patents